(12) United States Patent
Nguyen et al.

(10) Patent No.: US 6,169,321 B1
(45) Date of Patent: Jan. 2, 2001

(54) METHOD AND SYSTEM FOR LOCALLY ANNEALING A MICROSTRUCTURE FORMED ON A SUBSTRATE AND DEVICE FORMED THEREBY

(75) Inventors: Clark T. -C Nguyen; Kun Wang, both of Ann Arbor, MI (US)

(73) Assignee: The Regents of the University of Michigan, Ann Arbor, MI (US)

(*) Notice: Under 35 U.S.C. 154(b), the term of this patent shall be extended for 0 days.

(21) Appl. No.: 09/305,513

(22) Filed: May 5, 1999

Related U.S. Application Data

(62) Division of application No. 08/874,785, filed on Jun. 13, 1997, now Pat. No. 5,976,994.

(51) Int. Cl.[7] .................................................. H01L 29/40
(52) U.S. Cl. ............................ 257/536; 257/528; 257/75
(58) Field of Search ........................... 438/795; 257/467, 257/528, 536, 70, 75

(56) References Cited

U.S. PATENT DOCUMENTS

| | | |
|---|---|---|
| 5,144,184 | 9/1992 | Greiff . |
| 5,188,983 | 2/1993 | Guckel et al. . |
| 5,451,425 | 9/1995 | Vig . |
| 5,530,342 | 6/1996 | Murphy . |
| 5,645,684 | 7/1997 | Keller . |
| 5,696,591 | 12/1997 | White et al. . |
| 5,789,666 | 8/1998 | Bayer et al. . |
| 5,870,007 | 2/1999 | Carr et al. . |

FOREIGN PATENT DOCUMENTS 11-02691 * 1/1999 (JP) .

OTHER PUBLICATIONS

Kun Wang, et al., Frequency Trimming and Q–Factor Enhancement of Micromechanical Resonators Via Localized Filament Annealing, Transducers '97 Jun. 16–19, 1997, pp. 109–112, Chicago.

J. Peerlings, et al., Long Resonator Micromachined Tunable GaAs–AlAs Fabry–Perot Filter, 1997 IEEE, vol. 9, No. 9, Sep. 9, 1997.

* cited by examiner

*Primary Examiner*—David Hardy
(74) *Attorney, Agent, or Firm*—Brooks & Kushman P.C.

(57) ABSTRACT

A batch-compatible, post-fabrication annealing method and system are described that can be used to trim the resonance frequency and enhance the quality factor of mechanical microstructures, particularly micromechanical structures, such as micromechanical resonators. The technique involves running a current through a micromechanical structure, or through a nearby microstructure (e.g., a nearby resistor), thereby dissipating power and heating the structure to temperatures high enough to change its microstructure and/or its material properties, which then lead to changes in the microstructure's resonance frequency and quality factor. For micromechanical structures, this technique is particularly useful, since it allows for convenient, simultaneous trimming of many microstructures all at once, and can be implemented via the simple application of a voltage across the anchor points of a micromechanical structure.

26 Claims, 2 Drawing Sheets

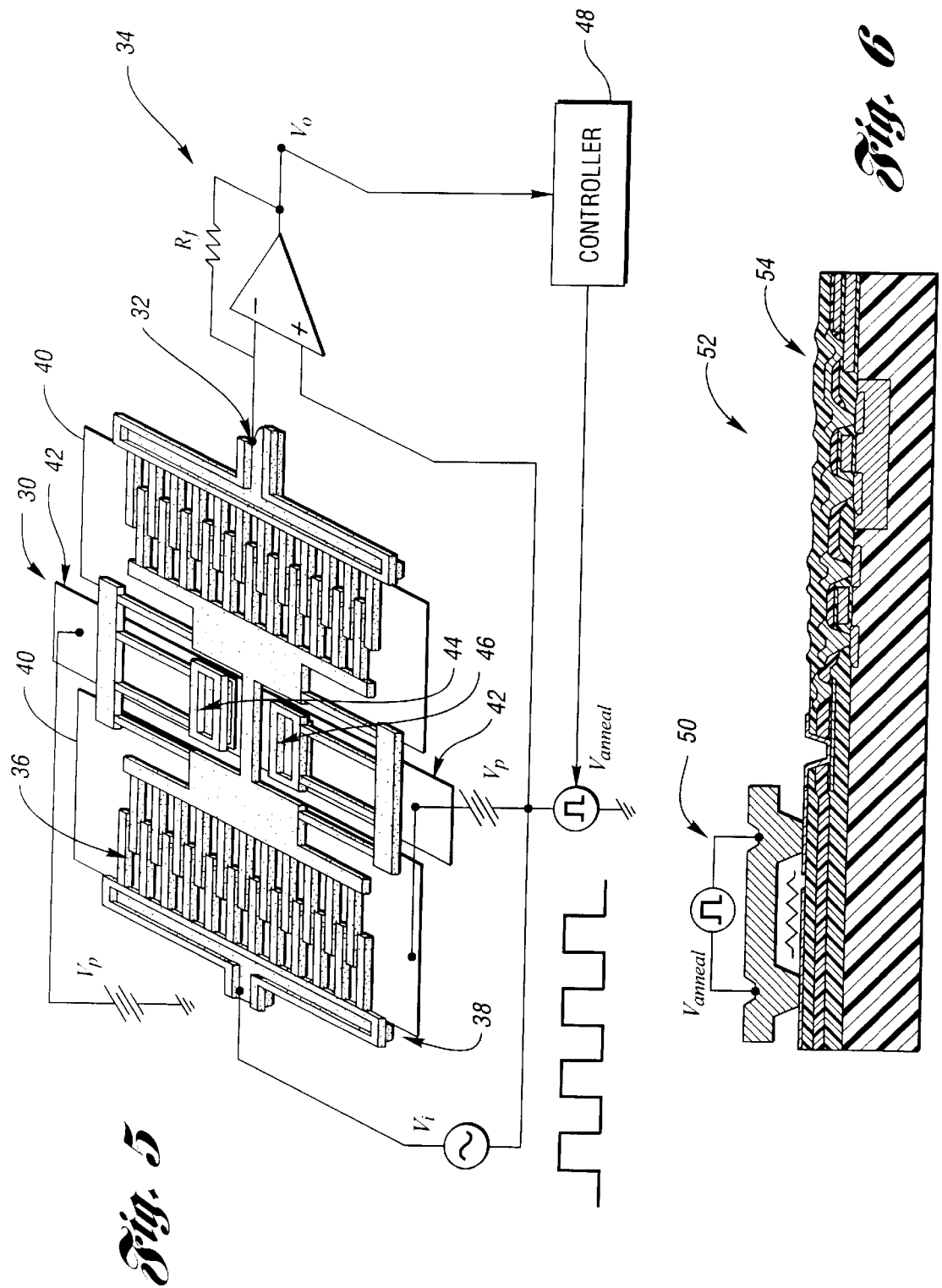

US 6,169,321 B1

METHOD AND SYSTEM FOR LOCALLY ANNEALING A MICROSTRUCTURE FORMED ON A SUBSTRATE AND DEVICE FORMED THEREBY

This is a divisional of application Ser. No. 08/874,785 filed on Jun. 13, 1997, now U.S. Pat. No. 5,976,994.

GOVERNMENT RIGHTS

This invention was made with government support under Contract No. ECS-9530190 awarded by the National Science Foundation. The government has certain rights in the invention.

TECHNICAL FIELD

This invention relates to methods and systems for annealing a microstructure formed on a substrate and, in particular, to methods and systems for locally annealing a microstructure formed on a substrate and devices formed thereby.

BACKGROUND ART

Many devices require post-fabrication trimming in order to operate within specifications. In particular, sensors and references (e.g., frequency references) require such trimming. For the case of macroscopic devices that are manufactured serially, trimming often does not comprise an overwhelming percentage of the total device cost. For the case of microscopic devices fabricated in batches (e.g., integrated circuits or micromechanical devices), trimming or programming can constitute a dominant percentage of device cost if it must be done serially. For example, laser trimming of micromechanical resonators to achieve a specific resonance frequency usually must be done serially, and thus, has low throughput and high cost.

With the advent of frequency specific applications for micromechanical resonators, such as oscillator references and highly selective bandpass filters, techniques for post-fabrication trimming of resonance frequencies are becoming increasingly important. This is especially true for recent communications applications of micromechanical resonators, in which large numbers of such resonators with precisely located center frequencies must realize parallel filter banks and multiple oscillator references. Since these applications will likely be batch-fabricated using planar technologies, high throughput trimming is desirable.

It is known that rapid thermal annealing (RTA) can change stress profiles in polysilicon thin films.

SUMMARY OF THE INVENTION

An object of the present invention is to provide a device and a method and system for locally annealing a microstructure such as a micromechanical device in situ on a substrate of the resulting device without affecting any other microstructure formed on the substrate.

Another object of the present invention is to provide a method and system for locally annealing a microstructure such as a micromechanical device in situ on a substrate which are especially useful in a batch-mode processing of such devices.

Yet another object of the present invention is to provide a method and system for locally annealing a micromechanical device such as a micromechanical resonator while the resonator is operating on a substrate to achieve a specific resonance frequency and Q factor enhancement at a relatively high throughput and low cost due largely to smaller thermal time constants for the microscale structure.

Yet still another object of the present invention is to provide an electronically-based method and system for locally annealing a micromechanical device such as a resonator in situ on a substrate to allow fabrication at relatively low temperatures which may, in turn, enable merged circuit and microstructure technologies and also allow a wide frequency trimming range without large DC voltages. For example, polysilicon structural material may be deposited amorphous at a low temperature then locally annealed into polycrystalline material which has better material characteristics.

In carrying out the above objects and other objects of the present invention, a method is provided for locally annealing a predetermined microstructure formed on a substrate. The method includes the step of controllably raising the energy state of the predetermined microstructure over a period of time sufficient to change material and/or microstructural properties of the predetermined microstructure without substantially affecting any other microstructure formed on the substrate.

The predetermined microstructure is preferably a micromechanical device such as a micromechanical resonator having a resonance frequency and a Q factor. The step of controllably raising is preferably accomplished by controllably heating the resonator sufficient to cause not only the resonance frequency but also the Q factor of the resonator to change.

Preferably, the method further includes the steps of causing the resonator to oscillate and monitoring the resonance frequency. The step of controllably heating heats the resonator until the resonator has a desired resonance frequency.

In one embodiment, the micromechanical resonator includes a beam.

In another embodiment, the micromechanical resonator is a folded-beam micromechanical resonator. In both embodiments, the micromechanical resonator is typically a polysilicon resonator.

The microstructure typically has a resistance and wherein the step of controllably heating includes the step of causing an electrical current to flow through the predetermined microstructure to heat the predetermined microstructure.

Also, preferably, the method further includes the steps of forming a pair of electrodes on the substrate electrically coupled to the predetermined microstructure and applying an electrical signal at the electrodes. The electrical signal may be a DC signal, but is preferably a time-varying signal such as a signal having one or more pulses.

Preferably, the substrate is a semiconductor substrate, but it also may be glass or other substrates. The semiconductor substrate may be a silicon semiconductor substrate.

The predetermined microstructure may be a semiconductor microstructure such as a silicon semiconductor microstructure. In one embodiment, the predetermined microstructure initially has an amorphous silicon microstructure and wherein the step of controllably heating changes the amorphous silicon microstructure to a polycrystalline or crystalline silicon microstructure.

The microstructure may form part of a microelectromechanical device.

Further in carrying out the above objects and other objects of the present invention, a system is provided for locally annealing a predetermined microstructure formed on a substrate of a device. The system includes an annealing power supply and means adapted to be coupled to a microscopic part of the device for transferring power from the annealing power supply to the microscopic part of the device in the form of an electrical signal so that microscopic part of the device converts the transferred power to a controlled amount of heat over a period of time sufficient to change material and/or microstructural properties of the predetermined microstructure without significantly affecting any other microstructure formed on the substrate.

Still further in carrying out the above objects and other objects of the present invention, a device is provided having at least one microstructure formed on a substrate. The device has electrodes formed on the substrate and electrically coupled to a predetermined microstructure to receive an electrical signal. The electrical signal causes an electrical current to flow through the predetermined microstructure to controllably and directly heat the predetermined microstructure over a period of time sufficient to change material and/or microstructural properties of the predetermined microstructure without affecting any other microstructure formed on the substrate.

Yet still further in carrying out the above objects and other objects of the present invention, a device is provided having at least one microstructure formed on a substrate. The device includes a resistive heating element formed on the substrate immediately adjacent a predetermined microstructure and adapted to receive a signal. The signal causes the element to indirectly heat the predetermined microstructure over a period of time sufficient to change material and/or microstructural properties of the predetermined microstructure without affecting any other microstructure on the substrate.

Preferably, the device further includes a microplatform thermally isolated from the substrate and wherein the resistive heating element and the microstructure are formed on the microplatform.

The method of the invention is a batch-mode trimming technique for micromechanical devices such as resonators by which the quality factor of such micromechanical resonators can be increased or decreased for electronic filtering, oscillator, and gyroscopic applications.

The method and system achieve both controllable frequency trimming and quality factor enhancement in microscale mechanical devices. The method and system are electrically-activated and can be implemented on a massive scale, in a similar fashion to programming an EEPROM. The method and system both allow for post-fabrication frequency trimming of microresonator devices, and through its Q-enhancement capability, enable low temperature fabrication of high-Q micro-scale resonators, which may in turn enable merged circuit+microstructures processes where structures are fabricated after MEMS.

The above objects and other objects, features, and advantages of the present invention are readily apparent from the following detailed description of the best mode for carrying out the invention when taken in connection with the accompanying drawings.

BRIEF DESCRIPTION OF THE DRAWINGS

FIG. 5 is a perspective schematic diagram illustrating the method and system of the first embodiment of the present invention with respect to a comb-driven, folded-beam micromechanical resonator wherein the frequency trimming is done in situ while the resonator is being operated; and FIG. 6 is a side schematic diagram of a microelectromechanical system wherein the invention is employed in situ without affecting on-chip circuits.

BEST MODE FOR CARRYING OUT THE INVENTION

Figure 1:
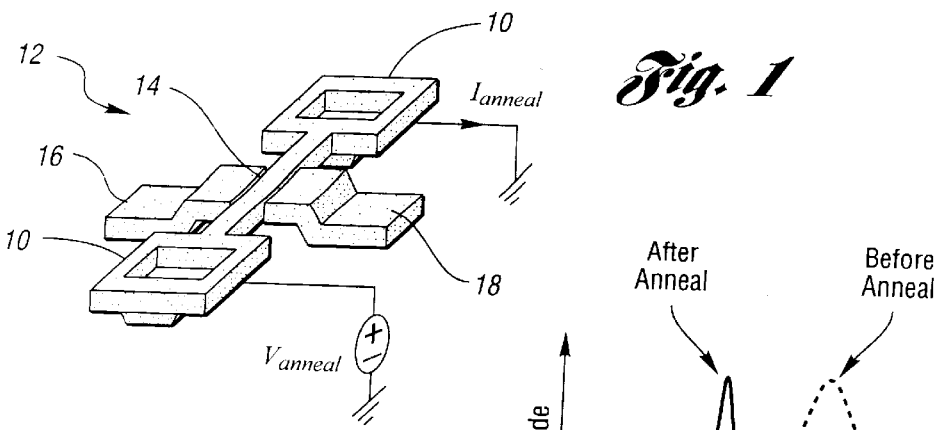
FIG. 1 is a schematic diagram of a relatively simple micromechanical resonator and a circuit for applying a voltage across anchors of the resonator to directly heat the resonator in accordance with a first embodiment of the present invention.

Referring now to the drawing figures, there is illustrated in FIG. 1 one embodiment of the method and system of the present invention. In particular, FIG. 1 presents one possible embodiment of the localized annealing method and system of the present invention. Here, a voltage $V_{anneal}$ is applied between anchors 10 of a conductive micromechanical device or structure (in this case, a micromechanical resonator), generally indicated at 12 in FIGS. 1, 3 and 4, which has a resistance $R_{struct}$ between its terminals. Application of this voltage sources a current $I_{anneal}$ which flows through a beam 14 of the structure 12 and dissipates a power given by:

$$P_{anneal} = I_{anneal}^2 R_{struct}$$

With sufficient voltage, $V_{anneal}$, the structure 12 can be heated to a temperature where annealing occurs, upon which its frequency and quality factor (i.e. Q factor) will change as material and microstructural properties, such as defect density, change. Due to the microscopic size of the structure 12, very little power (e.g., 20 mW) is required to reach temperatures in excess of 1000 Kelvin.

A drive electrode 16 causes the beam 14 to oscillate upon the application of an electrical signal thereto. A sense electrode 18 senses the oscillations of the beam 14.

Figure 2:
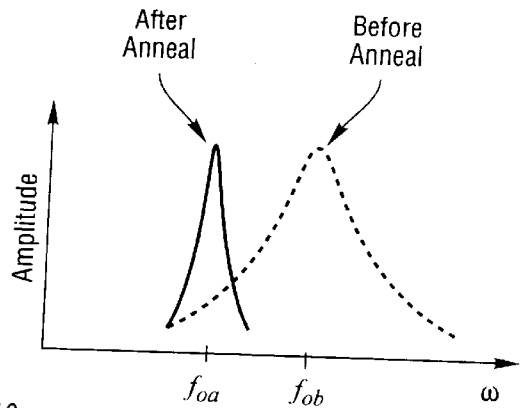
FIG. 2 is a graph which illustrates how a frequency characteristic of a device formed through the method and system of the present invention changes by having a different frequency and a higher Q.

Referring now to FIG. 2, there is illustrated the result of localized annealing in accordance with the present invention. Here, an initial resonator at frequency $f_{ob}$ is locally annealed, resulting in a new frequency characteristic, with new resonance frequency $f_{oa}$ and a much higher quality factor (i.e., a sharper peak).

The resonance frequency of the micromechanical resonator 12 changes upon annealing. One possible mechanism for this resonance frequency change is because internal stresses are modified, and resonance frequency is generally a function of stress. The quality factor of the micromechanical resonator 12 is a function of defects within the structure, at both molecular and microstructural levels. The larger the concentration of defects, the lower the quality factor. Thus, since annealing of a structure removes these defects, it is also possible that annealing raises the quality factor.

Figure 3:
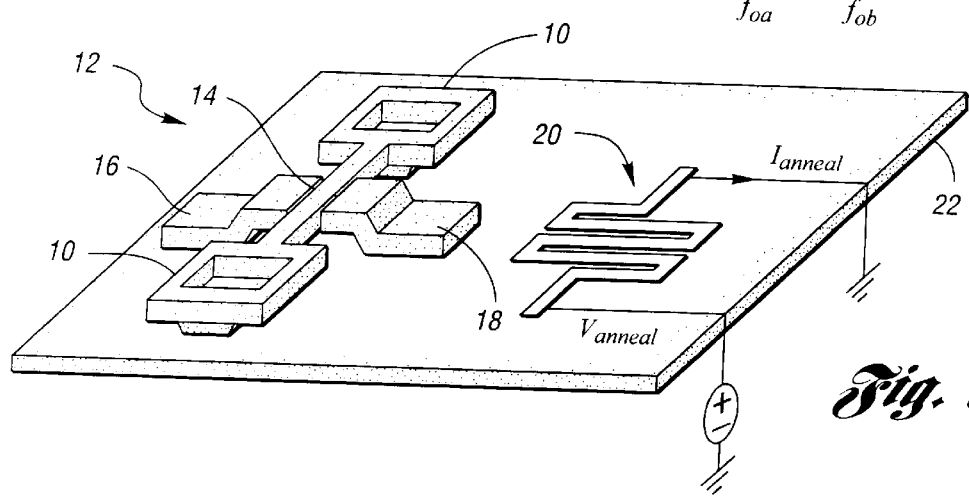
FIG. 3 is a schematic diagram of another embodiment of the method and system of the present invention wherein the micromechanical resonator is indirectly heated by a circuit.
Figure 4:
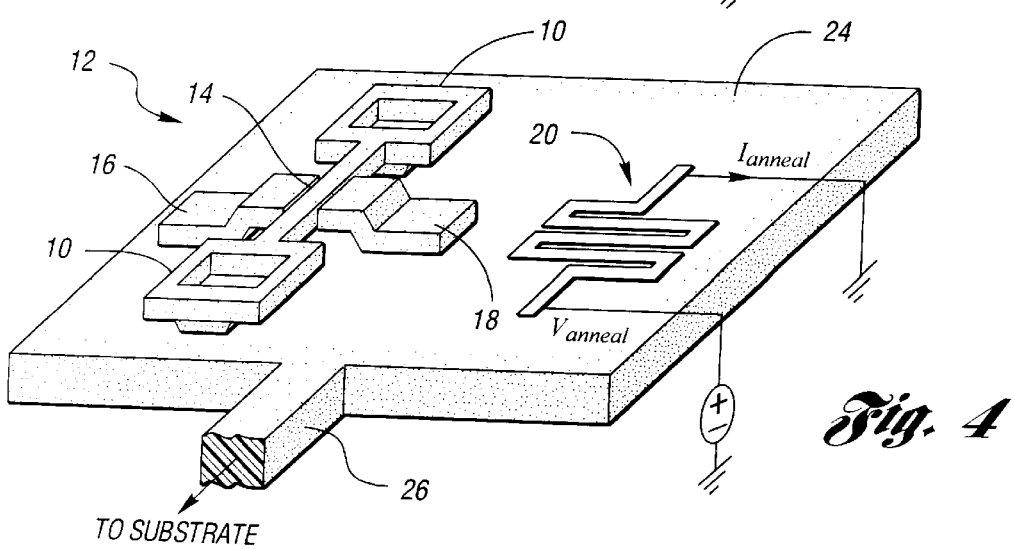
FIG. 4 is a schematic diagram of the embodiment of FIG. 3 with the addition of an isolating microplatform.

Other embodiments of the method and system for localized annealing are presented in FIGS. 3 and 4 with the same micromechanical resonator 12. Here, heating is achieved using a resistive heating device such as a resistor 20 located immediately adjacent or near the structure (i.e. resonator 12) to be annealed. In FIG. 3, the resistor 20 and structure 12 are situated directly on a substrate 22.

In FIG. 4, the resistor 20 and the structure 12 are situated on a microplatform 24, which is thermally isolated from the substrate (not shown in FIG. 4) via long, thin struts 26. The embodiment in FIG. 4 can achieve annealing with much lower power, since it has better thermal insulation.

The voltage applied for heating of the structure 12 using any of the embodiments need not be a DC voltage, as shown.

It can be pulsed (as illustrated in FIG. 5) or an AC signal for more controlled annealing, or for location-dependent annealing. For example, at very high frequencies, the current flows mainly over the surface of the structure 10 (due to the skin effect), and thus, high frequency voltages can be used to anneal only the structure's surface. Current crowding effects combined with thermal loss topologies can also be harnessed for location specific localized annealing.

FIG. 5 presents a schematic depicting details of this filament-like annealing procedure as applied to a properly biased and excited comb-driven, folded-beam μmechanical resonator 30 with sense electronics including a sense electrode 32 and an amplifier 34. The resonator 30 also includes a comb transducer 36 formed on a sliced ground plane 40 and a drive electrode 38. The resonator design is similar to prior art designs in all respects, except for the provision of distinct leads or annealing electrodes 42 coupled to anchors 44 and 46.

During normal resonator operation, the pulse voltage generator $V_{anneal}$ is inactive and provides the ground voltage for all components in this resonator system. In this configuration, the anchor leads 42 are tied to a DC-bias voltage $V_p$, and an AC drive signal is applied to the one or more of the transducer electrodes 38 to induce vibration. Once vibration is established, an output current is generated via a DC-biased, time-varying capacitor at the output electrode 32. This current is then sensed and amplified to a voltage, $V_o$, by the amplifier 34. FIG. 5 shows an open loop implementation but it is understood that a closed loop oscillator hookup can also be annealed in situ.

To anneal the μresonator 30 during induced vibration, the pulse voltage generator $V_{anneal}$ is activated. Depending on the requirements, $V_{anneal}$ is made to emit one or more voltage pulses of magnitude $V_{anneal}$ for each annealing cycle. During each pulse, the potentials of the input and output electrodes 46, the ground plane 40, and one of the resonator anchors 44 are raised by $V_{anneal}$, while the potential at the remaining resonator anchor 44 remains constant at $V_p$. Thus, each pulse effectively applies a voltage across the resonator 30, from anchor-to-anchor, of magnitude $V_{anneal}$, which then sources a current $I_{anneal}$ from anchor-to-anchor. This current flows through the resonator structure, dissipating a power given by:

$$P_{anneal} = I_{anneal}^2 R_{struct},$$

where $R_{struct}$ is the resistance between the anchors 44 and 46 of the resonator 30. Heat is thus generated throughout the resonator structure, raising its overall temperature and effectively annealing it.

A controller 48 monitors the voltage $V_o$ and is able to determine the resulting resonant frequency of the annealed microresonator 30. If the resulting resonant frequency is not the desired resonant frequency, the controller 48 sends a control signal to the pulse voltage generator to supply another pulse to further heat the microresonator 30.

Referring now to FIG. 6, there is illustrated a MEMS having both a micromechanical device 50 and microelectrical devices 52. The microelectrical device 52 may include a capacitor 54 and layers of PMOS and NMOS The annealing of the device 50 is possible without affecting the on-chip circuits in the merged microcircuit plus microstructure technology represented in FIG. 6.

The main advantage behind the localized annealing method and system of the present invention is its simplicity. The mere application of a voltage across anchor points is very easy to implement, and this simplicity makes the technique applicable to massive arrays of resonators fabricated using batch processes. Just as EEPROM's with millions of transistors are electronically programmable, this localized annealing technique allows the electronic tuning/trimming of micromechanical resonators, perhaps thousands of them on each die of a wafer. Trimming should be possible at the wafer level in batch-mode using localized annealing, and this can substantially lower the cost of micromechanical devices, perhaps making some of them economically feasible for the first time.

Furthermore, these localized annealing procedures invite several novel circuits+micromechanical device technologies. For example, the recent MICS technology attempted to modularly merge CMOS and micromechanics by first implementing CMOS, then microstructures. The main problem in this process was in depositing microstructural layers above CMOS, since the deposition temperature required to achieve stress-free polysilicon structures (600° C.) is greater than the eutectic temperature of aluminum contacts (540° C.). Localized annealing can solve this problem by allowing deposition of silicon at lower temperatures (at which it is deposited amorphous), then localized annealing of individual structures (in a batch process) to crystallize the silicon, making it conductive and annealing away the stress. This results in a foundry-compatible merged technology process that can enable sensor and microactuator products.

While the best mode for carrying out the invention has been described in detail, those familiar with the art to which this invention relates will recognize various alternative designs and embodiments for practicing the invention as defined by the following claims.

What is claimed is:

1. A system for locally annealing a predetermined microstructure formed on a substrate of a device, the system comprising:

an annealing power supply; and means adapted to be coupled to a microscopic part of the device for transferring power from the annealing power supply to the microscopic part in the form of an electrical signal so that microscopic part of the device converts the transferred power to a controlled amount of heat over a period of time sufficient to change material and/or microstructural properties of the predetermined microstructure without significantly affecting any other microstructure formed on the substrate.

2. The system as claimed in claim 1 wherein the predetermined microstructure is a micromechanical device.

3. The system as claimed in claim 2 wherein the micromechanical device is a micromechanical resonator having a resonance frequency and a Q factor.

4. The system as claimed in claim 3 wherein the heat is sufficient to cause the resonance frequency of the resonator to change.

5. The system as claimed in claim 4 further comprising an electrical power supply adapted to be coupled to a driver of the resonator for supplying an electrical drive signal to the driver so that the resonator oscillates and a controller for monitoring the resulting resonance frequency wherein the controller controls the electrical signal from the annealing power supply until the resonator has a desired resonance frequency.

6. The system as claimed in claim 3 wherein the heat is sufficient to cause the Q factor to change.

7. The system as claimed in claim 3 wherein the heat is sufficient to cause the resonance frequency and the Q factor to change.

8. The system as claimed in claim 3 wherein the micromechanical resonator includes a beam having a pair of anchors.

9. The system as claimed in claim 3 wherein the micromechanical resonator is a folded-beam resonator.

10. The system as claimed in claim 1 wherein the micromechanical resonator is a polysilicon resonator.

11. The system as claimed in claim 1 wherein the microscopic part of the device is the predetermined microstructure.

12. The system as claimed in claim 1 wherein the electrical signal is a time-varying signal.

13. The system as claimed in claim 12 wherein the time-varying signal is a signal having at least one pulse.

14. The system as claimed in claim 11 wherein the device has a pair of electrodes coupled at spaced positions to the microstructure and wherein the electrical signal is applied at the electrodes.

15. The system as claimed in claim 1 wherein the substrate is a semiconductor substrate.

16. The system as claimed in claim 15 wherein the semiconductor substrate is a silicon semiconductor substrate.

17. The system as claimed in claim 1 wherein the predetermined microstructure is a semiconductor microstructure.

18. The system as claimed in claim 17 wherein the semiconductor microstructure is a silicon semiconductor microstructure.

19. The system as claimed in claim 18 wherein the predetermined microstructure has an amorphous silicon microstructure and wherein the heat is sufficient to change the amorphous silicon microstructure to a polycrystalline or crystalline silicon microstructure.

20. The system as claimed in claim 1 wherein the microstructure forms part of a microelectromechanical device.

21. A device having at least one microstructure formed on a substrate, the improvement comprising:

electrodes formed on the substrate and electrically coupled to a predetermined microstructure to receive an electrical signal which, in turn, causes an electrical current to flow through the predetermined microstructure to controllably and directly heat the predetermined microstructure over a period of time sufficient to change material and/or microstructural properties of the predetermined microstructure without substantially affecting any other microstructure formed on the substrate.

22. The device as claimed in claim 21 wherein the microstructure is a micromechanical device having anchors and wherein the electrodes are electrically coupled to their respective anchors.

23. A device having at least one microstructure formed on a substrate, the improvement comprising:

a microplatform formed on and thermally isolated from the substrate;

at least one microstructure formed on the microplatform; and a resistive heating element formed on the microplatform and adapted to receive a signal which, in turn, causes the element to indirectly heat any microstructure formed on the microplatform including the at least one microstructure over a period of time sufficient to change material and/or microstructural properties of the at least one microstructure without substantially affecting any other microstructure formed on the substrate but not on the microplatform.

24. The device as claimed in claim 23 wherein the at least one microstructure is a micromechanical device.

25. A device having at least one microstructure formed on a substrate, the improvement comprising:

a resistive heating element formed on the substrate immediately adjacent a predetermined microstructure and adapted to receive a signal which, in turn, causes the element to indirectly heat the predetermined microstructure over a period of time sufficient to change material and/or microstructural properties of the predetermined microstructure without substantially affecting any other microstructure on the substrate.

26. The device as claimed in claim 25 wherein the microstructure is a micromechanical device.

* * * * *